(12) United States Patent
Raghavan et al.

(10) Patent No.: US 6,438,163 B1
(45) Date of Patent: Aug. 20, 2002

(54) CABLE LENGTH AND QUALITY INDICATOR

(75) Inventors: Sreen A. Raghavan, La Jolla; Doug J Easton, Westlake Village, both of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/161,346

(22) Filed: Sep. 25, 1998

(51) Int. Cl.[7] .............................. H03H 7/30; H03H 7/40; H03K 5/159
(52) U.S. Cl. ..................... 375/233; 324/617; 324/644
(58) Field of Search ................................ 375/233, 257; 379/400; 324/617, 644

(56) References Cited

U.S. PATENT DOCUMENTS

| | | | |
|---|---|---|---|
| 4,456,893 A | 6/1984 | Otani | 333/18 |
| 4,701,936 A | 10/1987 | Clark | 375/14 |
| 4,888,560 A * | 12/1989 | Ogura | 330/254 |
| 4,974,185 A | 11/1990 | Ohno et al. | 364/724.13 |
| 5,031,194 A | 7/1991 | Crespo | 375/14 |
| 5,119,196 A | 6/1992 | Ayanoglu | 358/167 |
| 5,245,291 A * | 9/1993 | Fujimura | 324/617 |
| 5,291,499 A | 3/1994 | Behrens | 371/43 |
| 5,465,272 A | 11/1995 | Smith | 375/295 |
| 5,481,564 A * | 1/1996 | Kakuishi et al. | 375/230 |
| 5,502,735 A | 3/1996 | Cooper | 371/43 |
| 5,602,507 A | 2/1997 | Suzuki | 329/304 |
| 5,617,450 A | 4/1997 | Kakuishi | 375/230 |
| 5,638,065 A | 6/1997 | Hassner et al. | 341/59 |
| 5,654,667 A | 8/1997 | Adachi | 329/306 |
| 5,809,079 A | 9/1998 | Hayashi | 375/262 |
| 5,818,378 A | 10/1998 | Cheng | 341/155 |
| 5,841,478 A | 11/1998 | Hu | 348/426 |

(List continued on next page.)

FOREIGN PATENT DOCUMENTS

| | | | |
|---|---|---|---|
| DE | 196 26 076 | 2/1997 | |
| EP | 0410399 A2 * | 1/1991 | ............ H04N/5/44 |
| JP | 2-215236 | 8/1990 | |
| JP | 6-334692 | 12/1994 | |
| JP | 08172366 A | 2/1996 | |
| JP | 3-116275 | 5/1996 | |
| JP | 9-148944 | 6/1997 | |
| JP | 409153845 A | 6/1997 | ............ H04B/3/04 |
| WO | WO 97/11544 | 3/1997 | |

OTHER PUBLICATIONS

American National Standard for Information Systems, "Fibre Distributed Data Interface (FDDI) –Part: Token Ring Twisted Pair Physical Layer Medium Dependent (TP–PMD)," ANSI X3:263:199X (1995), pp. 239–329.
Institute of Electrical and Electronics Engineers, New York, "IEEE Standards for Local and Metropolitan Area Networks," IEEE Standard 802.3u–1995 CSMA/CD Access Method, Type 100Base–T (1995).
IEEE 802.3ab, Gigabit Long Haul Copper Physical Layer Standards Committee, (1997).
Lee, E.A. et al., Digital Communications (1988), pp. 34–42 & 319–345.
Oppenheim, A.V. et al., "Discrete–Time Signal Processing," (1989), pp. 149–191.
Sklar, B., "Digital Communications, Fundamentals and Applications," (1988), pp. 333–337.

Primary Examiner—Mohammad H. Ghayour
(74) Attorney, Agent, or Firm—Skjerven Morrill LLP; Gary J. Edwards (57) ABSTRACT

A receiver that calculates the length of the transmission channel cable based on the receiver parameters is presented. The cable length is calculated based on the gain of an automatic gain control circuit or is based on the multiplier coefficients of an equalizer of the receiver. A comparison between a cable length calculated using the gain from the automatic gain control circuit and a cable length calculated using the multiplier coefficients of the equalizer indicates the quality of the cable.

15 Claims, 5 Drawing Sheets

U.S. PATENT DOCUMENTS

| | | | |
|---|---|---|---|
| 5,841,484 A | 11/1998 | Hulyalker et al. | 348/607 |
| 5,859,861 A | 1/1999 | Oh | 371/43.7 |
| 5,872,668 A | 2/1999 | Mutu | 360/65 |
| 5,895,479 A | 4/1999 | Suganuma | 708/301 |
| 5,909,384 A | 6/1999 | Tal | 364/724.19 |
| 5,940,442 A | 8/1999 | Wong | 375/232 |
| 5,949,819 A | 9/1999 | Bjarnason | 375/222 |
| 5,960,011 A | 9/1999 | Oh | 371/46 |
| 5,982,818 A | 11/1999 | Krueger et al. | 375/265 |
| 5,986,831 A | 11/1999 | Mutu | 360/46 |
| 6,035,007 A | 3/2000 | Khayrallah et al. | 375/341 |
| 6,038,269 A | 3/2000 | Raghavan | 375/340 |
| 6,047,022 A | 4/2000 | Reuvan | 375/345 |
| 6,115,418 A | 9/2000 | Raghavan | 375/233 |
| 6,148,046 A | 11/2000 | Hussein | 375/345 |

* cited by examiner

- Frequency Response of a Bad 30 Meter Cable

CABLE LENGTH AND QUALITY INDICATOR

BACKGROUND

1. Field of the Invention

This invention relates to digital communication systems and, more particularly, to determining the cable length and cable quality of the transmission medium.

2. Background

The dramatic increase in desktop computing power driven by intranet-based operations and the increased demand for time-sensitive delivery between users has spurred development of high speed Ethernet local area networks (LANs). 100BASE-TX Ethernet (see IEEE Std. 802.3u-1995 CSMA/CD Access Method, Type 100 Base-T) using existing category 5 (CAT-5) copper wire, and the newly developing 1000BASE-T Ethernet (see IEEE Draft P802.3ab/D4.0 Physical Layer Specification for 1000 Mb/s Operation on Four Pairs of Category 5 or Better Twisted Pair Cable (1000 Base-T)) for Gigabit/s transfer of data over category 5 data grade copper wiring, require new techniques in high speed symbol processing. On category 5 cabling, gigabit per second transfer can be accomplished utilizing four twisted pairs and a 125 megasymbol/s transfer rate on each pair where each symbol represents two bits.

Physically, data is transferred using a set of voltage pulses where each voltage represents one or more bits of data. Each voltage in the set is referred to as a symbol and the whole set of voltages is referred to as a symbol alphabet.

One system of transferring data at high rates is Non Return to Zero (NRZ) signaling. In NRZ, the symbol alphabet {A} is {−1, +1}. A logical "1" is transmitted as a positive voltage while a logical "0" is transmitted as a negative voltage. At 125 M symbols/s, the pulse width of each symbol (the positive or negative voltage) is 8 ns.

An alternative modulation method for high speed symbol transfer is MLT 3 and involves a three level system. (See American National Standard Information system, Fibre Distributed Data Interface (FDDI)—Part: Token Ring Twisted Pair Physical Layer Medium Dependent (TP-PMD), ANSI X3.263:199X). The symbol alphabet for MLT 3 is {A}={−1, 0, +1}. In MLT 3 transmission, a logical 1 is transmitted by either a −1 or a +1 while a logic 0 is transmitted as a 0. A transmission of two consecutive logic "1" s does not require the system to pass through zero in the transition. A transmission of the logical sequence ("1", "0", "1") would result in transmission of the symbols (+1, 0, −1) or (−1, 0, +1), depending on the symbols transmitted prior to this sequence. If the symbol transmitted immediately prior to the sequence was a +1, then the symbols (+1, 0, −1) are transmitted. If the symbol transmitted before this sequence was a −1, then the symbols (−1, 0, +1) are transmitted. If the symbol transmitted immediately before this sequence was a 0, then the first symbol of the sequence transmitted will be a +1 if the previous logical "1" was transmitted as a −1 and will be a −1 if the previous logical "1" was transmitted as a +1.

The detection system in the MLT 3 standard, however, needs to distinguish between 3 levels, instead of two levels as in a more typical two level system. The signal to noise ratio required to achieve a particular bit error rate is higher for MLT 3 signaling than for two level systems. The advantage of the MLT 3 system, however, is that the energy spectrum of the emitted radiation from the MLT 3 system is concentrated at lower frequencies and therefore more easily meets FCC radiation emission standards for transmission over twisted pair cables. Other communication systems may use a symbol alphabet having more than two voltage levels in the physical layer in order to transmit multiple bits of data using each individual symbol. In Gigabit Ethernet over twisted pair CAT-5 cabling, for example, 5-level pulse amplitude modulated (PAM) data can be transmitted at a baud rate of 125 Mbaud.

In most ethernet receiver systems, cable quality or cable length is not monitored. Remote cable quality monitoring is a useful tool for system administrators. Difficulties with the transmission medium in a high-speed Ethernet application can lead to breakdowns in the receiver as a greater amount of distortion of the incoming signal due to the quality of the transmission channel becomes apparent. Therefore, there is a need for a receiver system that also indicates the length of the channel and the quality of the channel.

SUMMARY OF THE INVENTION

In accordance with the invention, a receiver that monitors the cable quality and indicates an estimate of the cable length is presented. The receiver monitors at least one parameter in the receiver and based on a known correlation between that parameter and the cable length, determines the cable length.

In one embodiment, the receiver includes a variable gain amplifier, a gain control circuit, and a cable processor. The cable processor receives the gain g from the gain control circuit and, based on a correlation between the gain g and cable length that is stored in the cable processor, determines the cable length.

In another embodiment, the receiver includes an equalizer that has adaptively chosen multiplier coefficients and a cable processor. The cable processor receives the multiplier coefficients from a coefficient update circuit that adaptively chooses the multiplier coefficients and computes a metric based on the multiplier coefficients. The metric is chosen to be a monotonic function of the cable length and, by comparing the metric with a known correlation between the metric and cable length, determines the cable length.

In yet another embodiment, a cable processor compares a cable length as determined with the gain g from a gain control circuit with a cable length as determined from a metric of the adaptively chosen equalizer coefficients. If the two calculations yield substantially the same results, then the cable has a "good" quality. A "poor" quality cable is detected when the two calculations yield substantially different results.

Embodiments of the invention are further explained below along with the following figures.

DESCRIPTION OF THE FIGURES

In the figures, elements having similar or identical functions have identical identifiers.

DETAILED DESCRIPTION OF THE INVENTION

Figure 1A:
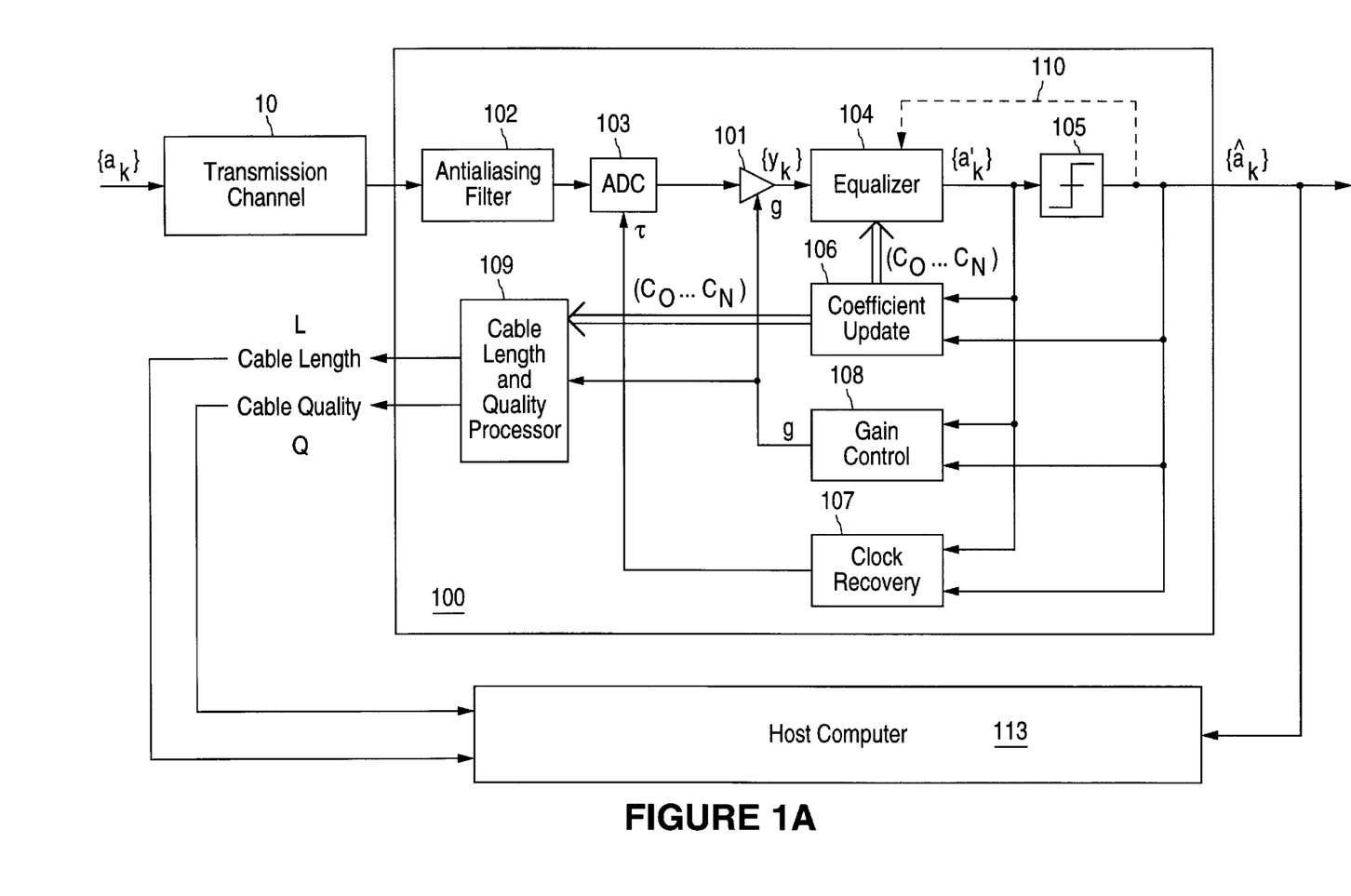
FIG. 1A shows a receiver system according to the invention.

FIG. 1A shows a receiver system 100 according to the present invention. An input symbol stream {$a_k$} is input to transmission channel 10. Transmission channel 10 can be twisted copper pair or some other transmission medium such as coaxial cable or optical fiber. The symbol stream {$a_k$} can be NRZ, MLT 3 or any other symbol alphabet and modulation that are used in transceivers of this type. The transmitted symbols in the sequence {$a_k$} are members of the symbol alphabet {A}. In the case of two level NRZ signaling, the symbol alphabet {A} is given by {−1, +1}. The index k represents the time index for that symbol, i.e. at sample time k, the symbol being transmitted to transmission channel 10 is given by $a_k$. The output signal from transmission channel 10, now an analog signal, suffers from channel distortion, the addition of random noise, and a flat signal loss, is input to receiver 100.

Figure 1B:
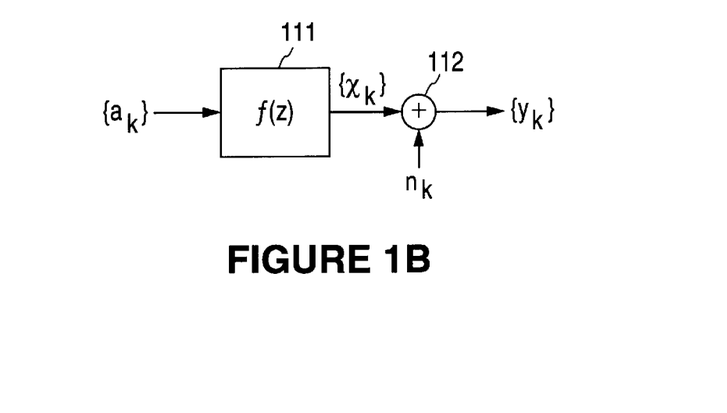
FIG. 1B shows a block diagram of a discrete time model of a transmission channel.

A discreet-time model of the response of transmission channel 10 is shown in FIG. 1B and includes a channel response 111, represented by the channel function f(z), and noise adder 112, which represents addition of a random noise factor $n_k$ to the transmitted signal.

For the sake of simplicity, a baseband transmission system is assumed, although the techniques shown are easily extended to a passband transmission system. (See E. A. LEE AND D. G. MESSERSCHMITT, DIGITAL COMMUNICATIONS (1988)) It is also assumed that the channel model includes the effect of transmit and receive filtering. In addition, the transmission channel is assumed to be linear in that two overlapping signals simply add as a linear superposition. Therefore, the channel function polynomial of channel response 111 can be defined as $$f(Z) = f_0 + f_1 Z^{-1} + f_2 Z^{-2} + \ldots + f_N Z^{-N}, \quad (1)$$

where $f_0, \ldots, f_j, \ldots, f_N$ are the polynomial coefficients representing the dispersed component of the (k−j) th symbol present in the $a_k$th symbol and N is a cut-off integer such that $f_j$ for j>N is negligible. The polynomial f(Z) represents the Z-transformation of the frequency response of the transmission channel. ($Z^{-1}$ represents a one period delay) See A. V. OPPENHEIM & R. W. SCHAFER, DISCRETE-TIME SIGNAL PROCESSING 1989.

The noiseless output signal of transmission channel 10 at sample time k, i.e. the output signal from channel response 111, is then given by $$X_k = f_0^* a_k + f_1^* a_{k-1} + \ldots f_N^* a_{k-N}, \quad (2)$$

where, without loss of generality, $f_0$ can be assumed to be 1. Thus, the channel output signal at time k depends, not only on transmitted data at time k, but past values of the transmitted data. This effect is known as "intersymbol interference" (ISI). See LEE & MESSERSCHMITT.

Intersymbol interference is a result of the dispersive nature of the communication channel. The IEEE LAN standards require that systems be capable of transmitting and receiving data through at least a 100 meter cable. In a 100 meter cable, the signal strength at the Nyquist frequency of 62.5 Mhz is reduced nearly 20 db at the receiving end of the cable. Given this dispersion, a single symbol may affect symbols throughout the transmission cable.

The noise element of the input signal, represented by noise adder 112, is represented by the sequence {$n_k$}. Therefore, the noisy output of the channel is given by $$y_k = x_k + n_k, \quad (3)$$

where the noise samples {$n_k$} are assumed to be independent and identically distributed Gaussian random variables (see LEE & MESSERSCHMITT) with variance equal to $\sigma^2$.

In FIG. 1A, the analog signal output of transmission channel 10, which is the input symbol sequence {$a_k$} distorted by the transmission channel in the above fashion, is input to receiver 100.

Anti-aliasing filter 102 prevents anti-aliasing by passing the input signal through a low pass filter to reject out-of-band noise. The analog to digital converter (ADC) 103 samples and holds the input signal for a duration of the symbol period, which in one embodiment is 8 ns. The digitized signals $y_k$ are then input to amplifier 101, which compensates for loss of signal that is experienced in transmission channel 10. The gain g of amplifier 101 is adjusted by gain control 108 in order to optimize the receiver function. An example of known values of g for several cable lengths are given in Table I. Although amplifier 101 in FIG. 1A is shown as a digital amplifier located between ADC 103 and equalizer 104, one of ordinary skill in the art will recognize that amplifier 101 can also be an analog amplifier located anywhere before ADC 103 in the signal processing sequence of receiver 100. Additionally, the gain shown in Table I is unaffected by the placement of amplifier 101 in receiver 100.

TABLE I

| Cable Length (meters) | Amplifier Gain g (normalized) |
| --- | --- |
| 0 | 1.0 |
| 20 | 1.3 |
| 40 | 1.74 |
| 60 | 2.3 |
| 80 | 3.1 |
| 100 | 4.15 |

The output signal from amplifier 101, $Y_k$, is input to equalizer 104. In equalizer 104, the effects of the channel distortion are countered and the equalizer 104 outputs signal $a_k'$. If equalizer 104 is a decision feedback equalizer, then line 110 is inserted to provide the feed-back section of equalizer 104 with the output signal slicer 105. Slicer 105 inputs signal $a_k'$ from equalizer 403 and decides on the output symbol $\hat{a}_k$.

In one embodiment of the invention using MLT-3 symbols, slicer defines the output symbol $\hat{a}_k$ as:

$$\hat{a}_k = \begin{cases} 1 & a_k' > 0.5 \\ 0 & -0.5 < a_k' < 0.5, \\ -1 & a_k' < -0.5 \end{cases} \quad (4)$$

assuming ideal values for $a_k'$ are {−1, 0, +1}. Other definitions of the output symbol in terms of the input symbol are required for other symbol alphabets.

Receiver 100 is coupled to host computer 113 so that host computer 113 receives the output symbol $\hat{a}_k$. Host computer 113 is any system capable of receiving the output symbol stream {$\hat{a}_k$}.

Equalizer multiplier coefficients to equalizer 104 are adaptively chosen in the coefficient update block 106. Clock recovery 107 tracks the timing of the circuit and adjusts the timing phase τ for the sample and hold function of the analog to digital converter (ADC) 103. Clock recovery 107 adjusts the timing phase τ by estimating the zero crossings in the signal stream {$a_k'$} and comparing the occurrence of those zero crossings with the estimated zero-crossings of the input signal.

Gain control 108 adjusts the gain of multiplier 101 by comparing the modulus of signal $a_k'$ with a target threshold value. The gain of multiplier 101 compensates for the channel flat loss factor $1/g$.

Cable processor 109 computes the cable length based on operating parameters. In one embodiment of the invention, cable processor 109 of receiver 100 receives the gain g and compares the gain g with a known correlation between the gain g and the cable length. In one embodiment, cable processor 109 computes the cable length based on the gain g. For the example of the correlation shown in Table I, the cable length L is given by $$L \approx [1.0232 + 7.8e^{-3}g + 2e^{-4}g^2]. \tag{5}$$

In another embodiment of the invention, the gain g is compared with a stored look-up table to estimate the cable length. Some embodiments can extrapolate between entries in the look-up table in order to arrive at a more accurate estimate of the cable length from the gain g. In one embodiment of the invention, cable processor 109 is implemented in software within host computer 113, in which case receiver 100 outputs the gain g to host computer 113.

Assuming that equalizer 104 is arranged to supply no gain to the signal, the signal amplitude is controlled by the automatic gain control (AGC) circuit. The automatic gain control circuit sets the average value of the equalized signal to a predetermined constant, regardless of the loss in the cable. Gain control at time k is given by $$g^{k+1} = g^k - \beta e_k \hat{a}_k. \tag{6}$$

Again, $e_k$ is the difference between $\hat{a}_k$ and $a_k'$, i.e., $e_k = (a_k' - \hat{a}_k)$. The parameter $\beta$ determines the rate at which the gain converges to an equilibrium value. If set too high, then the gain parameter may be too volatile. However, if $\beta$ is too low then the system is slow to respond to a need for increased gain. Typically, $\beta$ is approximately $10^{-3}$. The converged value of the gain g is higher for a longer length cable because the root mean squared (RMS) value of the received signal amplitude decreases as the length of the cable increases. Table I shows an example of the correlation between the gain g and the cable length.

Equalizer 104 may be any kind of equalizer structure. In general, two types of equalizer appropriate for use in Equalizer 104 are a linear equalizer and a decision feedback equalizer (LEE & MESSERSCHMIDT). Equalizers of this type that are applicable to 100 or 1000 BASE-T Ethernet over category-5 wiring, 24 gauge twisted copper pair, are discussed in "Improved Detection for Digital Communication Receivers," U.S. application Ser. No. 08/974,450, filed Nov. 20, 1997, of Sreen Raghavan, assigned to the same assignee as the present application, herein incorporated by reference in its entirety; and "Simplified Equalizer for Twisted Pair Channel," U.S. application Ser. No. 09/020,628, filed Feb. 9, 1998, by Sreen Raghavan, assigned to the same assignee as the present disclosure, herein incorporated by reference in its entirety.

Figure 2:
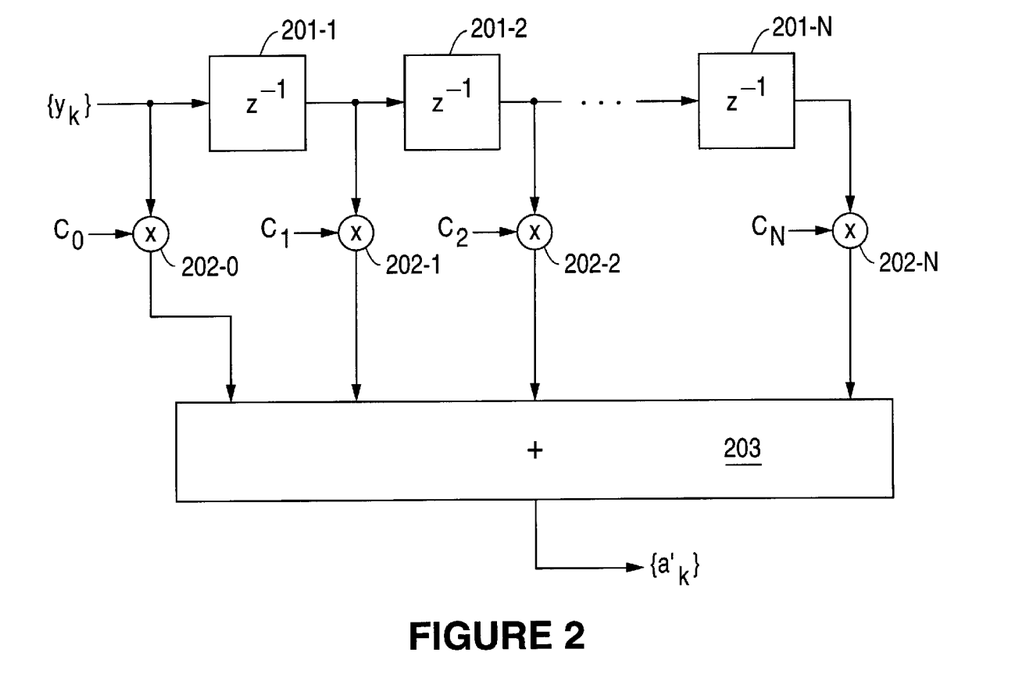
FIG. 2 shows a linear equalizer.

FIG. 2 shows a linear equalizer 200 utilized in one embodiment of the invention as equalizer 104 (FIG. 1A). Equalizer 200 includes N delays 201-1 through 201-N, N+1 multipliers 202-0 through 202-N, and an adder 203. Each of the delays 201-1 through 201-N delays a symbol by one symbol period T. Each input symbol $\{y_k\}$ is processed through the delays so that the output signal from delay 201-1 through 201-N is $y_{k-1}$ through $y_{k-N}$, respectively. Multiplier 202-0 multiplies $Y_k$ by $C_0$ and multipliers 202-1 through 202-N multiplies $Y_{k-1}$ through $y_{k-N}$, respectively, by $C_1$ through $C_N$, respectively. Adder adds together the outputs from all of the multipliers 202-0 through 202-N. The sum, which is also the output of equalizer 104 (FIG. 1A), is given by $$a_k = C_0 y_k + C_1 y_{k-1} + C_2 y_{k-2} + \ldots + C_N y_{k-N}. \tag{7}$$

The signal $a_k'$ from linear equalizer 200 is input to slicer 105 (FIG. 1A) which decides, based on the value of $a_k'$, on the output value of the receiver $\hat{a}_k$. The output symbol $\hat{a}_k$ is the symbol from symbol alphabet $\{A\}$ of which $a_k$ is a member, which best approximates the input signal $a_k'$. Equation 6 indicates the determination of $\hat{a}_k$ based on $a'_k$ for MLT-3 symbol processing.

The multiplier coefficients, $C_0$ through $C_N$, define a transfer function T given by $$T = C_0 + C_1 Z^{-1} + C_2 Z^{-2} + \ldots + C_N Z^{-N}. \tag{8}$$

A zero-forcing linear equalizer (ZFLE) has a transfer function T(Z) given by the inverse of the frequency response of the transmission channel f(Z). A minimum mean squared error based linear equalizer (MMSE-LE) optimizes the mean squared error between the transmitted data and the detected data, thereby finding a compromise between the un-canceled ISI at the output terminal of the equalizer and the noise variance.

The coefficients $C_0$ through $C_N$ are chosen by an intelligent algorithm in coefficient update 106. In FIG. 1A, the output of linear equalizer 104, $a'_k$, and the output of the slicer 105, $\hat{a}_k$, is input to coefficient update 106. In one embodiment, the coefficients of the equalizer are updated based on the least mean squared (LMS) algorithm (see E. A. LEE AND D. G. MESSERCHMITT, DIGITAL COMMUNICATIONS (1988)). The coefficients at time period k+1 are given by $$c_j^{k+1} = C_j^k - \alpha e_k y_{k-j}, \tag{9}$$

where $C_j^k$ is the jth multiplier coefficient of equalizer 200 (FIG. 2) at time k. The parameter $e_k$ is the difference between the input to the slicer, $a_k'$, and symbol output by the slicer, $\hat{a}_k$. The parameter a determines the rate at which the multiplier coefficients can vary. If $\alpha$ is too small, the multiplier coefficients converge too slowly. However, if $\alpha$ is too large then the multiplier coefficients are unstable and may oscillate around optimum values.

In the linear equalizer, the center tap can be assumed to be the midpoint position of the equalizer, i.e. the N/2 th coefficient. Without loss of generality, N is assumed to be an even integer. Therefore, the center coefficient $C^k_{(N/2)-1}$ is set to 1.0 for all k and is not adaptively chosen.

Alternatively, any of the multiplier coefficients may be set to 1. One of the multiplier coefficients $C_o$ through $C_N$ are set to 1 so that linear equalizer 200 will have a net gain of 1. Therefore, the signal amplitude is controlled by the gain control circuit.

The adaptive equalizer coefficients converge to a sampled spectrum approximately equal to the inverse of the coefficients of the inverse of the sampled channel transfer function.

The entire frequency response (in sample domain) of the equalizer can be computed as $$H(f) = \sum_{i=0}^{N} C_i e^{-j2\pi i fT}; \quad \frac{-0.5}{T} \le f \le \frac{0.5}{T}, \tag{10}$$

where T is the time period for one symbol (i.e., 1/T is the symbol baud rate).

In addition to the increased gain g required with longer cables, longer cables also produce more inter-symbol interference (ISI) due to greater insertion loss at high frequencies of the signal spectrum. Therefore, the amount of equalization needed at longer cables is greater. A monotonic function of the coefficients of the linear equalizer is, therefore, a measure of the cable length. For example, a measure of the cable length is given by the equalizer tilt across the spectrum of the channel:

$$m = \left| \frac{C_0 - C_1 + C_2 - \cdots + (-1)^{N-1} C_{N-1}}{C_0 + C_1 + \cdots + C_{N-1}} \right|. \quad (11)$$

In one embodiment of the invention, N is four (4) and $C_0$ is set to 1. Alternatively, a simpler metric than that given in Equation 11 is given by the absolute value of the right hand side coefficient next to the center tap of the equalizer normalized to the value of the center tap (which, as suggested above, could be 1), i.e.

$$m = \left| \frac{C_{N/2}}{C_{(N/2)-1}} \right|. \quad (12)$$

The magnitude of the coefficient of the linear equalizer next to the center tap increases as the length of the cable increases. Alternatively, if the multiplier coefficient of the first tap is 1, i.e. $C_o=1$, then the magnitude of the multiplier coefficient $C_1$ is a measure of cable length. Table II is a table of metrics versus cable length for a system having a linear equalizer with N=2 (i.e., Equation 8 reduces to a transfer function of $T=C_0+C_1Z^{-1}$) and $C_0=1$.

TABLE II

| Cable Length (meters) | $m = \frac{|C_1|}{|C_0|}$, Eq. 12 | $m = \frac{|C_0 - C_1|}{|C_0 + C_1|}$, Eq. 11 |
|---|---|---|
| 0 | 0 | 1 |
| 20 | 0.0547 | 1.1157 |
| 40 | 0.2969 | 1.8447 |
| 60 | 0.3828 | 2.2405 |
| 80 | 0.5 | 3.0 |
| 100 | 0.586 | 3.8302 |

Figure 3:
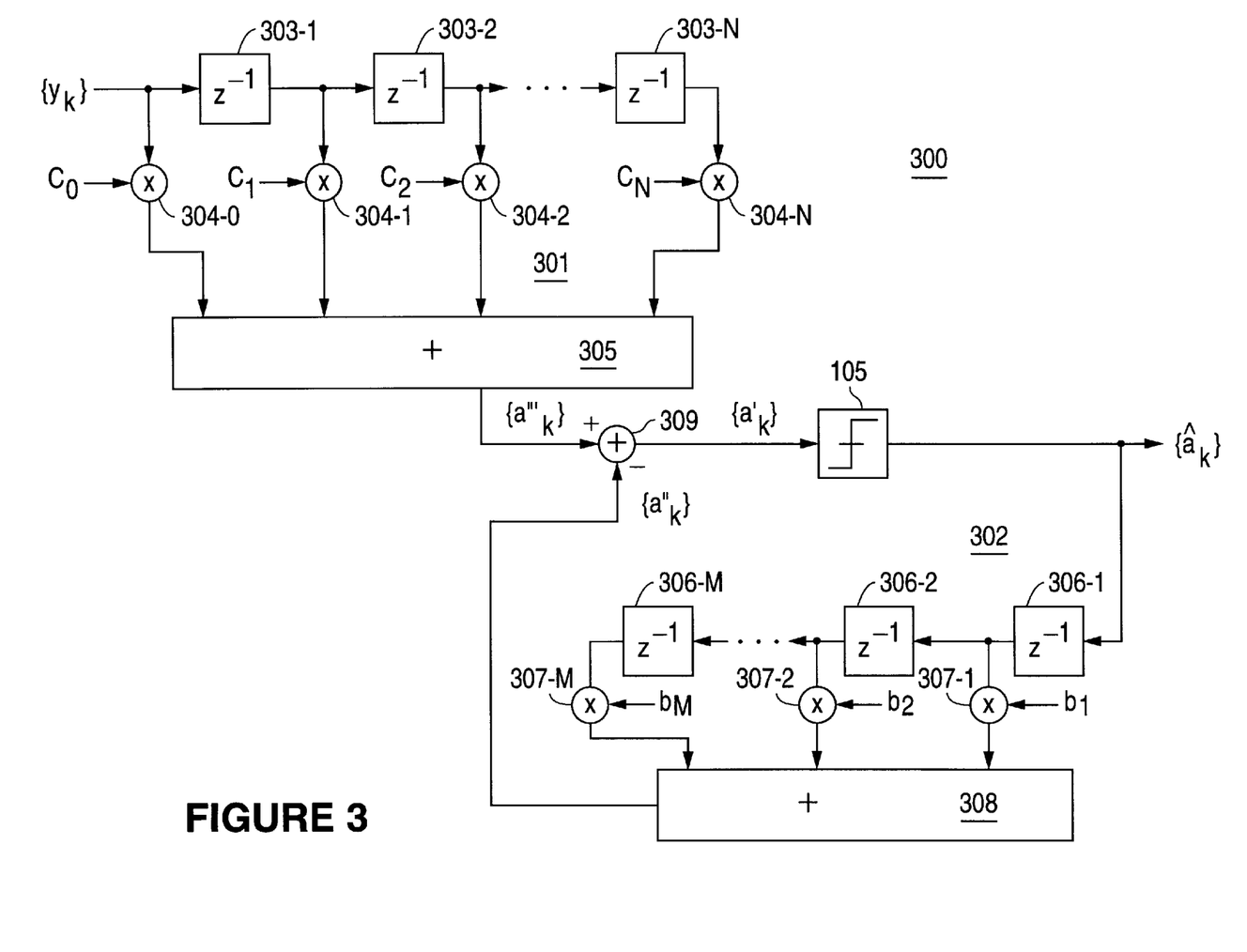
FIG. 3 shows a decision feedback equalizer.

FIG. 3 is a block diagram of a decision feedback equalizer (DFE) 300 that can be utilized as equalizer 104 of FIG. 1A. DFE 300 includes a feed forward equalizer (FFE) 301 and a feedback equalizer (FBE) 302. The symbol stream $\{Y_k\}$ is received into FFE 301. FFE 301 receives $y_k$ into delays 303-1 through 303-N coupled in series. The output signal from each of delays 303-1 through 303-N is $Y_{k-1}$ through $Y_{k-N}$, respectively. Multipliers 304-0 through 304-N are coupled to delays 303-1 through 303-N to receive $Y_k$ through $Y_{k-N}$, respectively. The output signal from multipliers 304-0 through 304-N is $C_0 y_k$ through $C_N y_{k-N}$, respectively, where the coefficients $C_0$ through $C_N$ are the multiplier coefficients of the FFE equalizer. The output signals from all of multipliers 304-0 through 304-N are summed in adder 305. The output of adder 305 is the output symbol stream from FFE 301, given by $$a'''_k = C_0 y_k + C_1 y_{k-1} + \ldots + C_N y_{k-N}. \quad (13)$$

Feedback equalizer (FBE) 302 includes delays 306-1 through 306-M coupled in series. Delay 306-1 receives the output symbol from slicer 105, $\hat{a}_k$. Multipliers 307-1 through 307-M receive the output signals from delays 306-1 through 306-M, $\hat{a}_{k-1}$ through $\hat{a}_{k-M}$, respectively. The output signals from multipliers 306-1 through 306-M are $b_1\hat{a}_{k-1}$ through $b_M\hat{a}_{k-M}$, respectively, where $b_1$ through $b_M$ are the multiplier coefficients of the FBE. The outputs signals from multipliers 306-1 through 306-M are summed in adder 308 to obtain the output of FBE 302, which is given by $$a''_k = b_1\hat{a}_{k-1} + b_2\hat{a}_{k-2} + \ldots b_M\hat{a}_{k-M}. \quad (14)$$

The output signal from FBE 302, $a_k''$, is subtracted from the output signal from FFE 301, $a_k'''$, in adder 309 to obtain $$a'_k = a'''_k - a''_k. \quad (15)$$

Slicer 105 receives $a_k'$ and determines the output symbol from receiver 100, $\hat{a}_k$, based on $a_k'$.

The output symbols from receiver 100 with decision feedback equalizer 300, therefore, is given by $$a'_k = \sum_{i=0}^{N} C_i^k y_{k-i} - \sum_{i=1}^{M} b_i^k \hat{a}_{k-i}, \quad (16)$$

where $C_0^k$ through $C_N^k$ are the adaptively chosen multiplier coefficients of FFE 301 and $b_1^k$ through $b_M^k$ are the adaptively chosen multiplier coefficients of FBE 302.

One of ordinary skill in the art will recognize that, assuming that FBE 302 removes the majority of the ISI, the multiplier coefficients of FBE 302 are dependent on the characteristics of the channel and that the multiplier coefficients of FFE 301 are not indicative of the cable length and quality and can be ignored because FFE 301 serves only to present FBE 302 with a sample stream where the ISI results only from past transmitted signals.. Therefore, a metric for indicating the cable length is given by $$m = \left| \frac{1 - |b_1| + |b_2| - \cdots + (-1)^M |b_M|}{1 + |b_1| + |b_2| + \cdots + |b_M|} \right|. \quad (17)$$

A simpler metric for indicating the cable length based on the multiplier coefficients of FBE 302 is given by $$m = |b_1|. \quad (18)$$

The simpler metric given in Equation 15 is very easy to compute but does not give as accurate a calculation as that presented in Equation 14.

The entire frequency response (in sample domain) of the feedback equalizer can be computed as $$H(f) = 1 - \sum_{i=1}^{M} b_i e^{-j2\pi i f T}; \frac{-0.5}{T} \leq f < \frac{0.5}{T}. \quad (19)$$

For a general equalizer 104 in receiver 100, therefore, the length of the cable can be computed in processor 109 either using the gain g from gain control 108 or can be computed by evaluating a metric of the multiplier coefficients of equalizer 104 that are adaptively chosen by coefficient update 106. If the gain g is used to calculate the length of the cable, the value of the gain g is compared with a known correlation between the required gain and the cable length. If a metric of equalizer coefficients, either an accurate metric or a simple metric, is used, then the metric is compared with a known correlation between cable length and the metric.

In some embodiments of the invention, the determination of whether to compute the length based on the gain, the accurate metric, or the simplified metric is selected by a host processor 113 (FIG. 1A). In other embodiments, the length is based on only one of the parameters.

Figure 4:
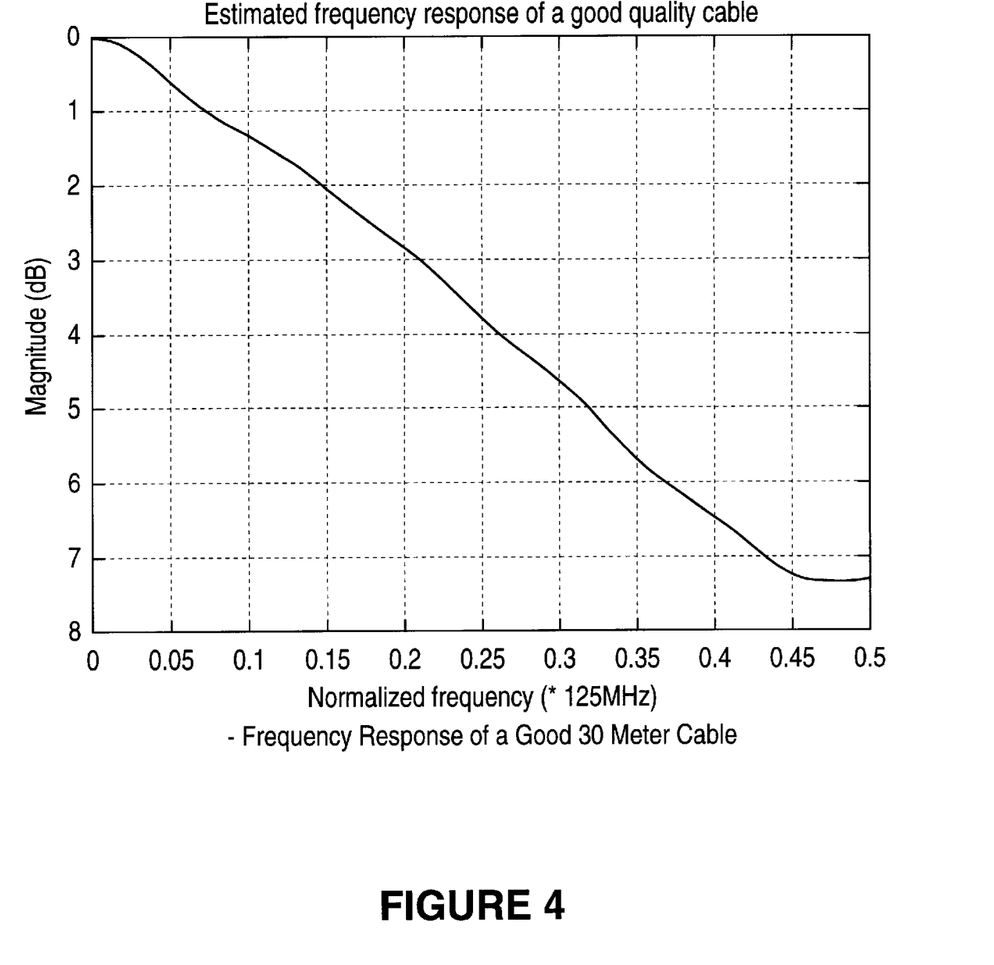
FIG. 4 shows the frequency response of a "Good" quality 30 meter cable.
Figure 5:
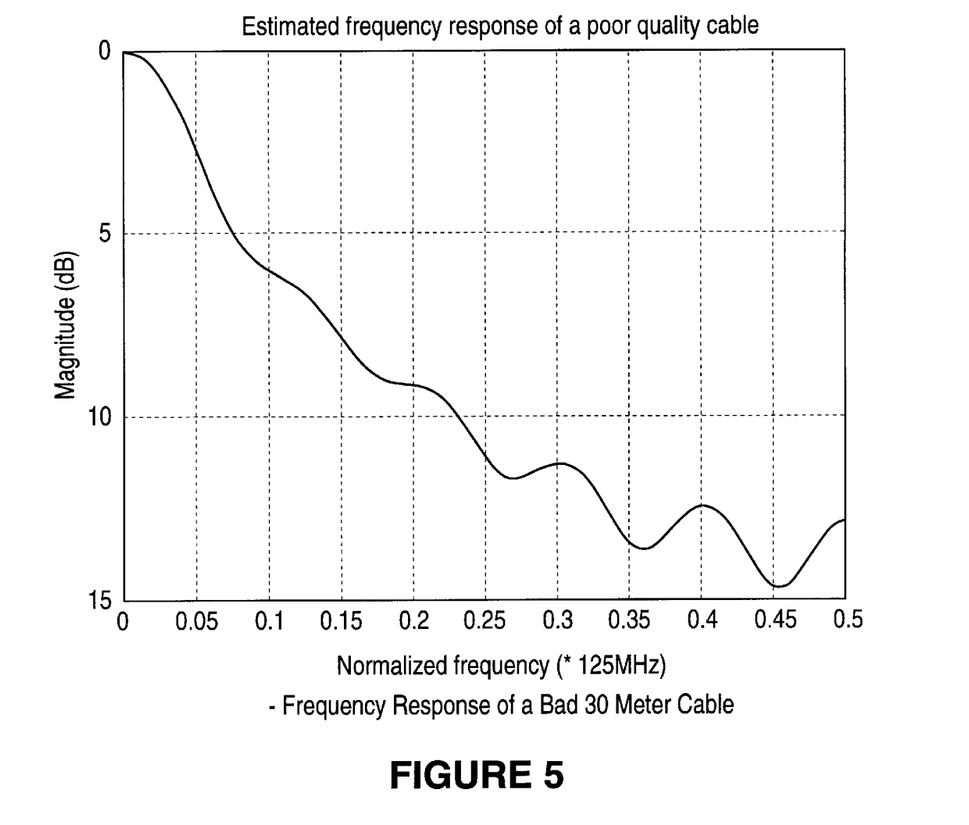
FIG. 5 shows the frequency response of a "Poor" quality 30 meter cable.

Some embodiments also indicate the quality of the cable by comparing the cable length as calculated by the gain with the cable length as calculated by either the accurate metric or the simplified metric. FIG. 4 shows a graph of the frequency response of a "good" quality thirty (30) meter cable. In contrast, FIG. 5 shows a graph of the frequency response of a "poor" quality thirty (30) meter cable. The difference between the "good" quality cable and the "poor" quality cable will be observed in the values of the multiplier coefficients of equalizer 104. The gain value determined by gain control 108, however, is relatively insensitive to the actual quality of the cable.

A determination of the quality of the cable, therefore, can be accomplished by comparing the cable length as calculated using the gain g with a cable length as calculated from a metric m. If the two calculations agree, then the cable quality is "good." If the two calculations significantly disagree, then the quality of the cable is "poor." In most embodiments, more than about ±15% deviation between the calculations is deemed to indicate a "poor" quality cable.

Figure 6:
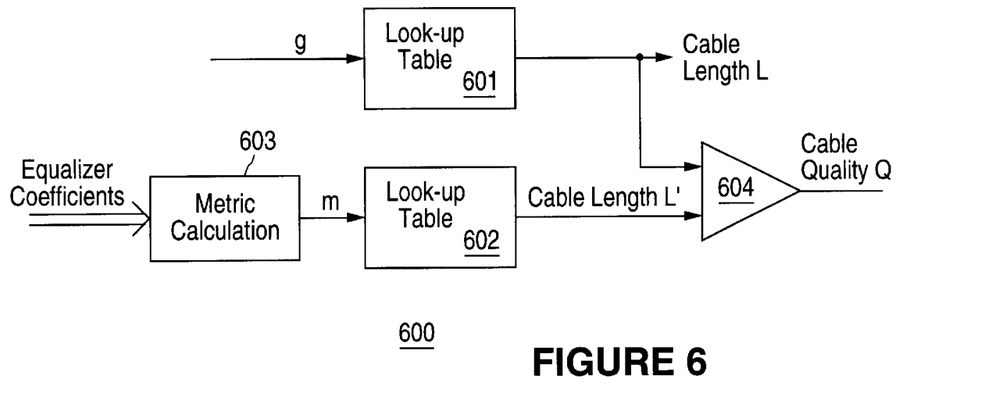
FIG. 6 shows a block diagram of a cable processor according to the present invention.

FIG. 6 shows an embodiment of a cable length and quality processor 600 according to the present invention. The gain g, calculated by gain control 108 (FIG. 1A), is input to look-up table 601. Look-up table 601 compares the gain g with a known relationship between the gain g and the cable length and outputs the cable length that corresponds to the gain g. An example of a known relationship between the gain g and the cable length is shown in Table I. Metric calculation 603 inputs the equalizer coefficients and calculates a metric m according to Equations 11 or 12 for linear equalizer coefficients or Equations 17 or 18 for decision feedback equalization. The metric m is input to look-up table 602, which compares the metric m with a known relationship between the metric m and the cable length and outputs a cable length that corresponds to the metric m. A known relationship between the metric m for a linear equalizer and the cable length is shown in Table II. The cable length output by look-up table 601 and the cable length output by look-up table 602 are compared in comparator 604 to obtain a cable quality indication Q.

In some embodiments, cable length and quality processor 600 is implemented in software in host computer 113 (FIG. 1A). In that case, receiver 100 (FIG. 1A) outputs to host computer 113 the equalizer parameters and the gain g. In other embodiments, cable length and quality processor 600 (FIG. 6) is implemented within receiver 100 (FIG. 1A).

The above examples are demonstrative only. One skilled in the art can recognize obvious variations which fall within the scope of this invention. As such, the invention is limited only by the following claims.

We claim:

1. A receiver, comprising:
an amplifier, the amplifier having a variable gain;
a gain control circuit that determines the variable gain;
an equalizer coupled to receive an output signal from the amplifier, the equalizer having equalizer coefficients;
a coefficient adaption that determines the equalizer coefficients; and
a cable processor that computes a first cable length estimate based on the variable gain of the amplifier and a second cable length estimate based on a metric determined from the equalizer coefficients and compares the first and second cable length estimates to determine the cable quality.

2. The receiver of claim 1, wherein the equalizer is a linear equalizer.

3. A receiver, comprising:
an amplifier, the amplifier having a variable gain;
a gain control circuit that determines the variable gain;
a cable processor that computes a cable length based on the variable gain of the amplifier;
a linear equalizer coupled to receive an output signal from the amplifier, the equalizer having equalizer coefficients; and
a coefficient adaption that determines the equalizer coefficients;
wherein the cable processor computes a second cable length based on a metric determined from the equalizer coefficients, the coefficients include the coefficients $C_0$ through $C_{N-1}$, and the metric is given by $$|(C_0 - C_1 + C_2 - \ldots + (-1)^{N-1} C_{N-1})/(C_0 + C_1 + \ldots C_{N-1})|.$$

4. The receiver of claim 3, wherein N=4 and $C_2$ is 1.

5. A receiver, comprising:
an amplifier, the amplifier having a variable gain;
a gain control circuit that determines the variable gain;
a cable processor that computes a cable length based on the variable gain of the amplifier;
a linear equalizer coupled to receive an output signal from the amplifier, the equalizer having equalizer coefficients; and
a coefficient adaption that determines the equalizer coefficients;
wherein the cable processor computes a second cable length based on a metric determined from the equalizer coefficients,
the equalizer coefficients include the coefficients $C_0$ through $C_N$, and the metric is given by $|C_{N/2}/C_{(N/2)-1}|$.

6. The receiver of claim 1, wherein the equalizer is a decision feedback equalizer.

7. A receiver, comprising:
an amplifier, the amplifier having a variable gain;
a gain control circuit that determines the variable gain;
a cable processor that computes a cable length based on the variable gain of the amplifier;
a decision feedback equalizer coupled to receive an output signal from the amplifier, the equalizer having equalizer coefficients; and
a coefficient adaption that determines the equalizer coefficients;
wherein the cable processor computes a second cable length based on a metric determined from the equalizer coefficients,
the equalizer coefficients include the coefficients $b_1$ through $b_M$, and
the metric is given by $$\left| \frac{1 - |b_1| + |b_2| - \cdots + (-1)^M |b_M|}{1 + |b_1| + |b_2| + \cdots + |b_M|} \right|.$$

8. The receiver of claim 6, wherein the equalizer coefficients include the coefficients $b_1$ through $b_M$ and the metric is given by $|b_1|$.

9. A receiver, comprising:
an amplifier, the amplifier having a variable gain;
a gain control circuit that determines the variable gain;

an equalizer coupled to receive an output signal from the amplifier, the equalizer having equalizer coefficients;

a coefficient adaption that determines the equalizer coefficients; and a cable processor that computes a first cable length based on the variable gain of the amplifier, and a second cable length based on a metric determined from the equalizer coefficients, wherein the cable processor includes:
- a first look-up table that outputs the first cable length in response to the variable gain;
- a second look-up table that outputs the second cable length in response to the metric of equalizer coefficients; and
- a comparator that outputs the cable quality based on a comparison between the first cable length and the second cable length.

10. The receiver of claim 9, wherein the first look-up table includes a known relationship between the amplifier gain and the cable length and the second look-up table includes a known relationship between the metric and the cable length.

11. The receiver of claim 1, further including a host computer that includes the cable processor.

12. The receiver of claim 3, further including a host computer that includes the cable processor.

13. The receiver of claim 5, further including a host computer that includes the cable processor.

14. The receiver of claim 7, further including a host computer that includes the cable processor.

15. The receiver of claim 9, further including a host computer that includes the cable processor.

* * * * *